United States Patent
Jia et al.

(10) Patent No.: US 12,254,641 B2
(45) Date of Patent: Mar. 18, 2025

(54) CROWD MOTION SIMULATION METHOD BASED ON REAL CROWD MOTION VIDEOS

(71) Applicant: Dalian Maritime University, Dalian (CN)

(72) Inventors: Peng Jia, Dalian (CN); Zongyao Wang, Dalian (CN); Yanbo Yang, Dalian (CN); Haibo Kuang, Dalian (CN); Yuzhe Zhao, Dalian (CN); Min Wan, Dalian (CN); ShuFang Tong, Dalian (CN); Jinwei Yao, Dalian (CN)

(73) Assignee: Dalian Maritime University, Dalian (CN)

( * ) Notice: Subject to any disclaimer, the term of this patent is extended or adjusted under 35 U.S.C. 154(b) by 376 days.

(21) Appl. No.: 17/854,032

(22) Filed: Jun. 30, 2022

(65) Prior Publication Data
US 2023/0015773 A1    Jan. 19, 2023

(51) Int. Cl.
*G06T 7/246*   (2017.01)
*G06V 20/52*   (2022.01)

(52) U.S. Cl.
CPC .............. *G06T 7/246* (2017.01); *G06V 20/53* (2022.01); *G06T 2207/20081* (2013.01); *G06T 2207/20084* (2013.01); *G06T 2207/30241* (2013.01)

(58) Field of Classification Search
CPC ........... G06T 7/246; G06T 2207/20081; G06T 2207/20084; G06T 2207/30241;
(Continued)

(56) References Cited

U.S. PATENT DOCUMENTS

2010/0091018 A1*   4/2010   Tatarchuk ............. G06T 15/005
                                                                        345/473
2018/0285656 A1*  10/2018   Yano .................... G06V 10/764
(Continued)

OTHER PUBLICATIONS

CrowdGAN: Identity-Free Interactive Crowd Video Generation and Beyond, by Liangyu Chai, Yongtuo Liu, Wenxi Liu, Guoqiang Han, Shengfeng He, pub IEEE Transactions on Pattern Analysis and Machine Intelligence (vol. 44, Issue: 6, 2022, pp. 2856-2871) DID: 10.1109/TPAMI.2020.3043372 on Dec. 8, 2020 (Year: 2020).*
(Continued)

*Primary Examiner* — Nancy Bitar
*Assistant Examiner* — Heath E. Wells
(74) *Attorney, Agent, or Firm* — Wood Herron & Evans LLP

(57) ABSTRACT

A crowd motion simulation method is provided based on real crowd motion videos. The method includes framing the videos and storing the framed videos into continuous high-definition images, generating a crowd density map of each image, and accurately positioning an individual in each density map to obtain the accurate position of each individual. The method also includes correlating the positions of each individual in different images to form a complete motion trajectory, and extracting motion trajectory data; and quantifying motion trajectory data, defining training data and data labels, and calculating data correlation. The method further includes building a deep convolutional neural network, and inputting the motion trajectory data for training to learn crowd motion behaviors; and randomly placing a plurality of simulation individuals in a two-dimensional space, testing a prediction effect of the deep convolutional neural network, adjusting parameters for simulation, and drawing a crowd motion trajectory.

8 Claims, 7 Drawing Sheets

(58) Field of Classification Search
CPC . G06T 5/70; G06T 7/277; G06T 2207/10016; G06T 2207/30196; G06V 20/53; G06V 10/454; G06V 10/763; G06V 10/7747; G06V 10/82; G06F 30/27; G06F 18/2321
USPC ........................................................ 382/103
See application file for complete search history.

(56) References Cited

U.S. PATENT DOCUMENTS

| | | | |
|---|---|---|---|
| 2020/0050872 A1* | 2/2020 | Ikeda | G06V 40/10 |
| 2021/0012506 A1* | 1/2021 | Chandran | G06T 7/11 |
| 2022/0138475 A1* | 5/2022 | Chowdhury | G06V 10/751 |
| | | | 382/103 |

OTHER PUBLICATIONS

Measuring Crowd Collectiveness with Trajectory Smoothing by Quy Nguyen Pham Phu, Vy Nguyen, Tien Do, Thanh Duc Ngo, pub 2018 1st International Conference on Multimedia Analysis and Pattern Recognition (MAPR) (2018, pp. 1-6) Digital Object Identifier: 10.1109/MAPR.2018.8337520 on Apr. 1, 2018 (Year: 2018).*

* cited by examiner

CROWD MOTION SIMULATION METHOD BASED ON REAL CROWD MOTION VIDEOS

CROSS REFERENCE TO RELATED APPLICATION

This patent application claims the benefit and priority of Chinese Patent Application No. 202110735986.7, filed on Jun. 30, 2021, the disclosure of which is incorporated by reference herein in its entirety.

TECHNICAL FIELD

The present disclosure relates to the field of computer simulation and, in particular, to a crowd motion simulation method based on real crowd motion videos.

BACKGROUND

Crowd motion trajectory simulation plays a very important role in crowd motion simulation technology. As an analysis tool, crowd motion trajectory simulation can be applied to the field of public safety, such as the design of ships, aircraft and other big vehicles, as well design of stadiums, subway stations and other large communal facilities.

Take a stadium as an example. Crowd motion simulation can be used to simulate a crowd trajectory in conventional scenarios such as fans' exit can be simulated according to the stadium design scale, thus giving assistance in analyzing whether the design of the corridor width, the number of exits and the location of exits are reasonable or not. It can also be used to simulate the crowd motion trajectory in unconventional scenarios such as conflicts, fires and terrorist attacks, thus giving assistance in the establishment of evacuation plans, reasonable arrangement of fire-fighting equipment and allocation of police forces in emergency circumstances. It can also be used as an auxiliary tool for venue managers to organize rehearsal or training for safety plans such as firefighting plan and anti-terrorism plan. Compared with traditional methods, crowd motion trajectory simulation brings various advantages, such as better visualization, flexibility, effectiveness, economic efficiency and free of personnel safety risk. Therefore, research on crowd motion trajectory simulation has received extensive attention from scholars at home and abroad.

Currently, crowd motion trajectory simulation is mainly based on crowd motion simulation models. The research of crowd motion simulation began in the 1980s. In 1987, Reynolds proposed the Boid flock simulation model, which is also one of the earliest crowd behavior models. The Boid model adopts the following three simple rules: (1) Align with other neighbors; (2) Try to be close to neighbors; (3) Avoid collision with other neighbors. Based on this, a crowd motion simulation model is established. The Boids model uses predefined rules to avoid collisions. In specific scenarios, however, crowds do not necessarily need to avoid collisions, but may be closely close to each other instead. Therefore, the Boids model cannot accurately simulate the separation of the crowds.

In 2007, Varasa and Cornejoa proposed a crowd motion model based on cellular automaton. The model approximately simulates the phenomenon of crowd motion through a small number of rules. Compared with complex behavior model, the calculation process is simple and efficient. However, given the complexity and uncertainty of crowd motion, the simulation is much more difficult than the crowd motion according to predetermined rules, which makes it impossible to accurately simulate crowding and collision behavior.

In 2009, J. Filler proposed a crowd dynamics model based on social dynamics from the perspective of social psychology. By probing into the characteristics of the crowd in a state of panic, the author puts forward three factors that may affect the crowd motion, and establishes a mixed model based on Newtonian dynamics and human psychology. Since the model contains a large number of acting force parameters, all kinds of acting forces are hardly balanced, and the complexity of calculation is high, which makes it difficult to get a smooth motion trajectory.

In addition to cellular automaton and social dynamics, Multi-agent model is also used to establish crowd dynamics models. Multi-agent model is composed of multiple Agents. Multiple Agents can work together to accomplish complex tasks that cannot be solved by an individual Agent. In the crowd model based on Multi-Agent, each Agent can be deemed as an agent with autonomy, sociality and initiative, and can perceive its surroundings independently. However, it is hard to apply the model to design rules oriented towards different scenarios or to connect these rules with human behaviors.

Traditional crowd motion trajectory simulation methods are often based on factors that affect pedestrian motion. Crowd behaviors are controlled by a set of predefined motion rules. Although these rules consider a variety of factors that affect pedestrian motion, they ignore the interaction between factors. Human behaviors are too complicated to be described by simple rules or mathematical equations. Therefore, simulation on this basis cannot accurately simulate the crowd motion trajectory. Therefore, it would be desirable to provide a crowd motion simulation method that improves these prior models and solutions.

SUMMARY

These and other technical objects and problems are addressed by the embodiments provided in the present disclosure, which provides a crowd motion simulation method based on real crowd motion videos.

The crowd motion simulation method based on real crowd motion videos includes the following steps:

Step 1, shooting real crowd motion videos, framing the videos and storing the framed videos into continuous high-definition images, generating a crowd density map of each image, and accurately positioning an individual in each density map to obtain an accurate position of each individual in the image;

Step 2, correlating the positions of each individual in different images to form a complete motion trajectory, and extracting motion trajectory data;

Step 3, quantifying the motion trajectory data, calculating data correlation, and selecting training data and data labels;

Step 4, building a deep convolutional neural network, and inputting the motion trajectory data processed in Step 3 for training to learn crowd motion behaviors; and Step 5, setting a two-dimensional space with an image size, randomly placing a plurality of simulation individuals in the two-dimensional space, testing a prediction effect of the deep convolutional neural network, adjusting parameters for simulation, and drawing a crowd motion trajectory.

Preferably, the shooting real crowd motion videos, framing the videos and storing the framed videos into continuous high-definition images, generating a crowd density map of each image, and accurately positioning an individual in each density map to obtain an accurate position of each individual in the image in Step 1 specifically includes:

Step 1a, shooting real crowd videos from a bird's eye view, extracting each frame of the videos and saving the extracted videos into high-definition images;

Step 1b, extracting a crowd density map of each image by a CSRnet convolutional neural network, and classifying the density map according to a crowd density value in the crowd density map in the following manner: when the density value is lower than a threshold, defining the density map by convolution of an impulse function with a Gaussian kernel; and when the crowd density is higher than the threshold, defining the density map by an adaptive Gaussian kernel;

Step 1c, denoising the density map, calculating, by OpenCV, a contour of each point in the density map in a manner of pixel cycling, and calculating a centroid of the contour; and Step 1d, clustering the centroid using a DBSCAN algorithm, and calculating an average value of clustered centroid points to obtain an accurate position of each individual in the image.

Preferably, the CSRnet convolutional neural network in Step 1b includes a VGG-16 convolutional neural network and a dilated convolution layer, with a convolution kernel size of 3 and a pooling layer of 2×2, and the convolution of an impulse function with a Gaussian kernel adopts a calculation equation (1), $$H(x) = \sum_{i=1}^{N} \delta(x - x_i) \tag{1}$$

where $x_i$ denotes a position of an assumed labeling point, N denotes the number of heads in an image, and $\delta(x-x_i)$ denotes an impulse function.

Preferably, the adaptive Gaussian kernel in Step 1b is calculated by equations (2), (3), and (4), $$F(x) = \sum_{i=0}^{N} \delta(x - x_i) \cdot G_{\delta_i}(x) \tag{2}$$

$$\delta_i(x) = \beta \overline{d_i} \tag{3}$$

$$\overline{d_i} = \frac{1}{m}\sum_{j=1}^{m} d_j^i \tag{4}$$

where G(x) denotes a Gaussian kernel function, $\delta_i$ is variable and is proportionate to $\overline{d_i}$, m denotes the number of heads adjacent to an ith head, $d_j^i$ denotes a distance between the ith head and a jth adjacent head, $\overline{d_i}$ denotes an average distance of distances from m adjacent heads, and β denotes a constant.

Preferably, the centroid of the contour in Step 1c is calculated by equations (5) and (6), $$x = \frac{\sum_{i=1}^{n} p_i x_i}{\sum_{i=1}^{n} p_i} \tag{5}$$

$$y = \frac{\sum_{i=1}^{n} p_i y_i}{\sum_{i=1}^{n} p_i} \tag{6}$$

where $x_i$ and $y_i$ denote a coordinate of a certain pixel point in an image in an x direction and a Y direction, respectively, $p_i$ denotes a pixel value of a certain pixel point in an image, and n denotes the number of pixel points in an image.

Preferably, the correlating the positions of each individual in different images to form a complete motion trajectory, and extracting motion trajectory data in Step 2 specifically includes:

Step 2a, clustering the positions of the individual between images by adopting a DBSCAN clustering algorithm to obtain a clustering trajectory of the individual; and Step 2b, performing smoothing on the clustering trajectory by a Kalman filter to obtain smooth and continuous motion trajectory data.

Preferably, the quantifying motion trajectory data in Step 3 specifically includes:

Step 3a: obtaining an individual g, a neighbor of the individual $N_g$, a motion velocity vector $[u_g,v_g]$ of the individual, and a motion vector $[u_j,v_j]$ (j∈$N_g$, j=1, 2, . . . , n) of the neighbor of the individual; and Step 3b: calculating a relative position vector from the individual g to a neighbor of the individual by equations (7) and (8), $$dx_j = x_j - x_g \tag{7}$$

$$dy_j = y_j - y_g \tag{8}$$

where position coordinates of the individual g are denoted as $[x_g, y_g]$, coordinates of a neighbor of the individual are denoted as $[x_j,y_j]$ (j∈$N_g$), the relative position vector from the individual g to a neighbor of the individual is denoted as $[dx_j,dy_j]$ (j∈$N_g$), and a set of neighbors of the individual g is denoted as $N_g$; and Step 3c: calculating a vector sum of relative position vectors from the individual to neighbors of the individual by equations (9) and (10), $$drx_g = \sum_{j \in N_g} dx_j \tag{9}$$

$$dry_g = \sum_{j \in N_g} dy_j \tag{10}$$

where the vector sum of the relative position vectors from the individual g to neighbors of the individual is denoted as $[drx_g, dry_g]$ (j∈$N_g$).

Preferably, the deep convolutional neural network built in Step 4 includes an input layer, an output layer and a hidden layer, the input layer includes n neurons, n denotes a dimension value of a training data set, data of the input layer are transmitted into the hidden layer through BatchNorm normalization (BatchNorm) and data format conversion (Reshape), the hidden layer is between the input layer and the output layer and includes a two-dimensional convolution layer, a LeakyReLU activation layer, a MaxPooling pooling layer and a Flatten layer, and the output layer is a fully connected layer; and the motion trajectory data processed in Step 3 are input for training to learn the crowd motion behaviors.

Preferably, the randomly placing a plurality of simulation individuals the two-dimensional space, testing a prediction effect of the deep convolutional neural network, adjusting parameters for simulation, and drawing a crowd motion trajectory in Step 5 specifically includes:

Step 5a, randomly placing the simulation individuals in the two-dimensional space, and predicting a motion trajectory of each of the individuals using the deep neural network; and Step 5b, conducting continuous prediction calculation t times in the depth neural network, and simulating the crowd motion trajectory in a virtual experiment platform.

The present disclosure provides a crowd motion simulation method based on real crowd motion videos, which can generate a high-quality crowd distribution density map, automatically and accurately identify positions of individuals in an image, obtain crowd motion trajectory data through DBSCAN algorithm, and learn crowd behaviors using a deep convolutional neural network, thus improving the accuracy of simulation.

BRIEF DESCRIPTION OF THE DRAWINGS

Further advantages, features and possible applications of the present invention will be apparent from the following detailed description in connection with the drawings. The accompanying drawings, which are incorporated in and constitute a part of this specification, illustrate one or more embodiments of the invention and, together with the general description given above and the detailed description given below, explain the one or more embodiments of the invention.

DETAILED DESCRIPTION

In order to make the objectives, technical solutions and advantages of the embodiments of the present disclosure clearer, the technical solutions in the embodiments of the present disclosure will be clearly and completely described below in conjunction with the drawings in the embodiments of the present disclosure. Obviously, the described embodiments are some, rather than all of the embodiments of the present disclosure. All other examples obtained by a person of ordinary skill in the art based on the examples of the present disclosure without creative efforts shall fall within the protection scope of the present disclosure. All other examples obtained by a person of ordinary skill in the art based on the examples of the present disclosure without creative efforts shall fall within the protection scope of the present disclosure.

Figure 1:
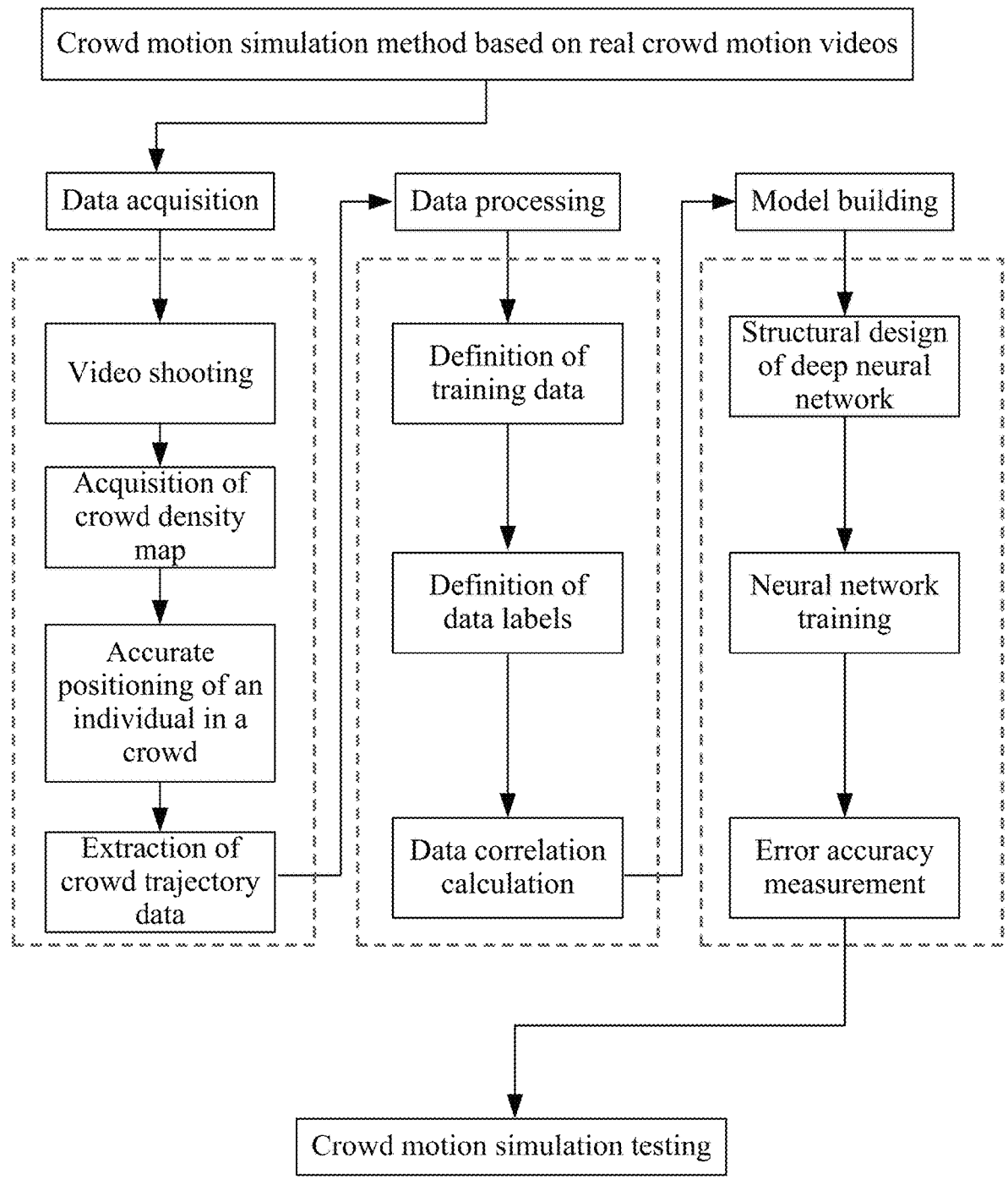
FIG. 1 is a flowchart of a method according to one embodiment.

FIG. 1 is a flowchart of the method according to the present disclosure. As shown in FIG. 1, the method in this embodiment may include the following steps.

An objective of the present disclosure is to provide a crowd motion simulation method based on real crowd motion videos, which is an innovative method different from existing traditional modes. It not only considers various factors that affect the crowd motion trajectory in the traditional method, but also combines the mutual influence of various factors, which improves the accuracy of the simulation. According to the method, the convolutional neural network is trained through the crowd motion trajectory data collected by the real surveillance videos. Deep learning training allows the deep convolutional neural network to learn the behavior rule of the crowd. With the prediction function of neural network, calculate the positions of the crowd in real time to simulate the crowd motion trajectory.

First, shoot real crowd motion videos, framing the videos and storing the framed videos into continuous high-definition images, generating a crowd density map of each image, and accurately positioning an individual in each density map to obtain an accurate position of each individual in the image. This process specifically includes the following steps.

Figure 2:
FIG. 2 is a high-definition diagram of a real crowd motion trajectory according to one embodiment.

(1) Video shooting. Obtain real data needed by the present disclosure by video shooting: extracting crowd motion trajectory data from the real crowd motion videos, framing the videos, and saving the framed videos into continuous high-definition images. The videos in the present disclosure were shot at a commercial plaza in Dalian from Jan. 1, 2020, to Jan. 3, 2020. This period often marks a high flow of people, during which crowd interaction behaviors are convenient to study. In addition, the crowd videos were shot from a bird's eye view. Extract each frame of the videos and save the extracted videos into high-definition images. Through the framing operation, obtain 832 continuous high-definition crowd images with a resolution of each frame being 1280× 720, as shown in FIG. 2.

Figure 3:
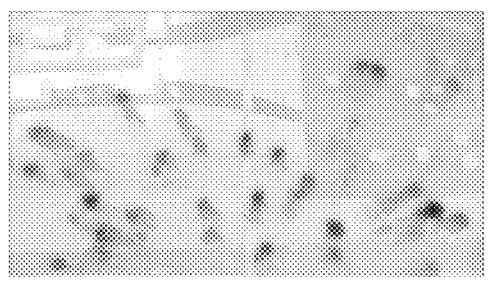
FIG. 3 is a high-quality crowd distribution density map according to one embodiment.

(2) Crowd density acquisition. In view of large number of images and high crowd density, manual recognition is impractical. Automatic individual position recognition is the only practicable alternative to accurately identify and locate an individual in the image. Extracted a crowd density map of each image by CSRnet convolutional neural network. The front end of CSRnet network is VGG-16 convolutional neural network. Since the convolutional layer will lead to smaller output images, the output of CSRnet network is ⅛ of the crowd density map of the original image. In order to obtain a high-resolution crowd density map, the back end of the CSRnet network uses a dilated convolution layer. The dilated convolution layer can expand the perceptual region while maintaining high resolution, so as to generate a high-quality crowd distribution density map, as shown in FIG. 3.

The density map is defined by convolution with of the impulse function with a Gaussian kernel, then labels with N heads can be expressed by equation (1):

$$H(x) = \sum_{i=1}^{N} \delta(x - x_i) \tag{1}$$

where $x_i$ denotes a position of an assumed labeling point, N denotes the number of heads in an image, and $\delta(x-x_i)$ denotes an impulse function. The density map generated by this function is not suitable for the case of large crowd density. When there is large crowd density, perspective transformation is required for the adaptive Gaussian kernel. Assuming that the crowd around each head are uniformly distributed, a reasonable estimation of geometric distortion can be obtained by calculating the average distance from its nearest m neighbors. The density function equation is as follows:

$$F(x) = \sum_{i=0}^{N} \delta(x - x_i) \cdot G_{\delta_i}(x) \tag{2}$$

$$\delta_i(x) = \beta \overline{d_i} \tag{3}$$

$$\overline{d_i} = \frac{1}{m} \sum_{j=1}^{m} d_j^i \tag{4}$$

where G(x) denotes a Gaussian kernel function, $\delta_i$ is variable and is proportionate to $\overline{d_i}$, m denotes the number of heads adjacent to an ith head, $d_j^i$ denotes a distance between the ith head and a jth adjacent head, $\overline{d_i}$ denotes an average distance of distances from m adjacent heads, and when the crowd density is large, β β=0.3 can better characterize head size.

Figure 4:
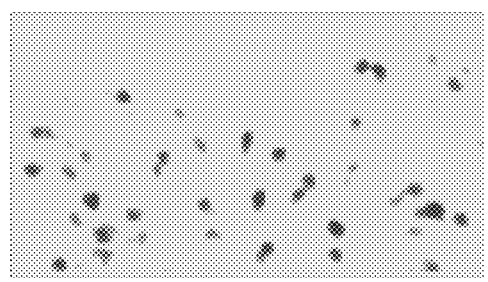
FIG. 4 is a denoised crowd distribution density map according to one embodiment.

In the present disclosure, the CSRnet convolutional neural network has a convolution kernel size of 3, a pooling layer of 2×2, and a stride of 1. The density map is obtained by convolution of the delta impulse function with a Gaussian function. Here, convolution is conducted first, followed by summing. For the purpose of precise positioning, it is also required to denoise the density map, as shown in FIG. 4.

(3) Accurate positioning of individual in a crowd. Calculate, by OpenCV, a contour of each point in a manner of pixel cycling and calculate a centroid of the contour. The centroid of an image is also known as the center of gravity of the image. At the image level, the pixel value of each point can be understood as the mass at this point. Considering that the image is two-dimensional, the centroid should be found independently in the x direction and Y direction, that is, in the x direction, the sum of image pixels on the left and right sides of the centroid is equal, and in the Y direction, the sum of pixels on the upper and lower sides of the centroid is equal. Calculation equations are as follows:

$$\sum_{i=1}^{n} p_i(x_i - x) = 0 \tag{5}$$

$$\sum_{i=1}^{n} p_i(y_i - y) = 0 \tag{6}$$

which may be rewritten as:

$$x = \frac{\sum_{i=1}^{n} p_i x_i}{\sum_{i=1}^{n} p_i} \tag{7}$$

$$y = \frac{\sum_{i=1}^{n} p_i y_i}{\sum_{i=1}^{n} p_i} \tag{8}$$

where $x_i$ and $y_i$ denote a coordinate of a certain pixel point in an image in an x direction and a y direction, respectively, $p_i$ denotes a pixel value of a certain pixel point in an image, and n denotes the number of pixel points in an image.

Figure 5:
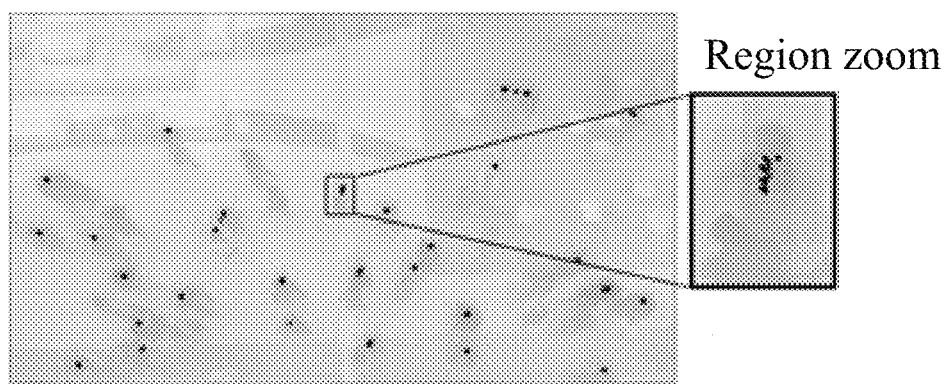
FIG. 5 shows multiple centroid maps of some individuals after region zoom according to one embodiment.
Figure 6:
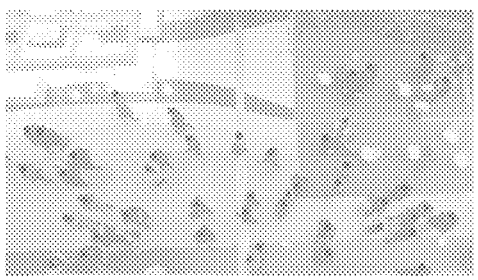
FIG. 6 is an accurate individual positioning map according to one embodiment.

Due to the influence of noise and error, some individuals may be composed of multiple centroids, as shown in FIG. 5. Through region zoom, multiple centroids of some individuals can be seen. In order to obtain an accurate position of an individual, these centroids are clustered using a DBSCAN algorithm. The average value of clustered centroid points is calculated to obtain an accurate position of each individual in the image, as shown in FIG. 6.

There are two important parameters in DBSCAN algorithm, namely Eps and MinPts, where Eps is a radius of neighborhood when defining density, and MinPts is a threshold when defining a core point. In the DBSCAN algorithm, data points are divided into core points, boundary points and noise points. If an object contains points with a number greater than MinPts points within its radius Eps, the points of the object are taken as the core points. Generally speaking, the core points correspond to the points inside a dense region, the boundary points correspond to the points at the edge of the dense region, and the noise points correspond to the points in a sparse region.

The closest distance between two people walking side by side in the same frame is 20 pixel points, so a smaller value of Eps helps to distinguish different individuals in space, where Eps is 15.

The value of MinPts is determined by the following procedure: first, calculate the average distance of k nearest points of all data points, then calculate the average distance of (k+1) nearest points of all data points, solve differences between the average distance of (k+1) nearest points of all data points and the average distance of k nearest points, namely the density change, and then sum up these differences, that is, calculate the sum of density changes of all points, find a minimum value of the sum of density changes, and the corresponding average distance of the nearest points can best reflect the density level of each point, so take the value of k+1 at this time as the value of k, that is, the value of MinPts, namely 3.

Then correlate the positions of each individual in different images to form a complete motion trajectory, and extract motion trajectory data. In order to carry out deep learning of neural network, it is necessary to extract the crowd trajectory data. The crowd trajectory data is composed of motion trajectory of each individual. Although each individual can be located one by one according to the order of the images, it is a tough task to associate positions of each individual in different images and form a complete trajectory. In view of this, DBSCAN clustering algorithm is used to cluster positions of an individual between images, and at this time, the time concept is taken as the starting point, and the MinPts is set as 2, thereby obtaining the trajectory data of the crowd.

Figure 7:
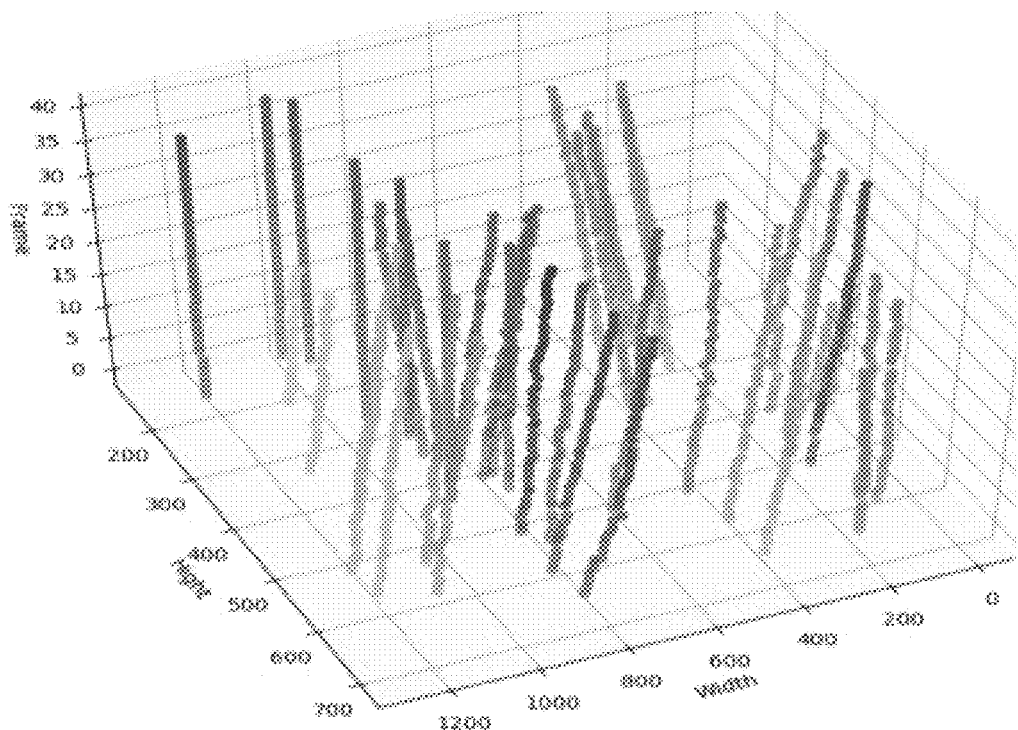
FIG. 7 is a scatter diagram of individual positions in a three-dimensional space according to one embodiment.

As shown in FIG. 7, the positions of an individual in a time domain can be represented as scatter points in a three-dimensional space. Since the size of each image is 1280×720, the numerical value of the three-dimensional space is within a range of 0-1280 in the Width axis direction, and within a range of 0-720 in the Hight axis direction. The Frame axis, as the time axis, representing the crowd location data of each image. Individuals in the crowd have a small range of motion between images, usually less than 10 pixels. The distance between people in the same image is larger, usually between 20 and 100 pixels. Therefore, the DBSCAN algorithm can be used again to cluster the trajectories of individuals in the crowd. FIG. 7 shows the clustering result of DBSCAN.

Figures 8, 9:
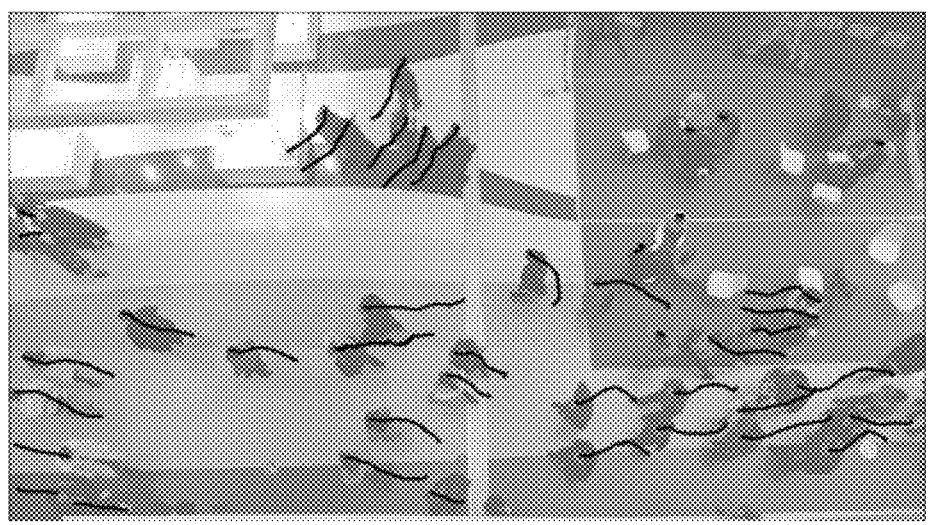
FIG. 8 shows crowd trajectory data extracted from 40 consecutive frames according to one embodiment.
FIG. 9 is a data correlation matrix diagram according to one embodiment.

Due to the error in data processing, the clustering trajectory obtained by DBSCAN fluctuates greatly. Therefore, the Kalman filter is used in the present disclosure to smooth the clustering trajectory. FIG. 8 shows crowd trajectory data extracted from 40 consecutive images. It can be seen from the figure that DBSCAN algorithm can effectively extract crowd trajectory data. Smooth and consecutive crowd trajectory data can be obtained by Kalman filtering.

In order to establish a crowd motion simulation model, it is necessary to train a deep neural network with big data. The trained depth neural network can simulate the interactive behavior of the crowd. To achieve this objective, it is necessary to generate and select appropriate training data from the obtained trajectory data. Through crowd trajectory clustering processing, the embodiment obtains a total of 24,000 pieces of trajectory data of individuals in the crowd are obtained in this embodiment. Through the data correlation analysis of the trajectory data, the most relevant data attributes are extracted, and deep learning is conducted using the selected data.

In order to analyze the correlation of data, it is necessary to establish a correlation matrix between data. The correlation matrix is composed of a correlation coefficient between the data attributes. The element in an i th row and a jth column in the correlation matrix is a correlation coefficient of an i th attribute and a jth attribute in the data. The larger the correlation coefficient is, the higher the correlation between the corresponding data attributes is.

Prior to data correlation analysis, it is required to quantify crowd trajectory data. If the individual is denoted as g, then the neighbor set of the individual g can be denoted as $N_g$. A motion velocity vector of the individual g is defined as $[u_g, v_g]$, and a motion vector of the neighbor of the individual g is denoted as $[u_j, v_j]$ ($j \in N_g$, j=1, 2, ..., n). The relative position vectors from the individual g to neighbors of the individual is denoted as $[dx_j, dy_j]$ ($j \in N_g$). If position coordinates of the individual g are denoted as $[x_g, y_g]$, and coordinates of a neighbor of the individual are denoted as $[x_j, y_j]$ ($j \in N_g$), the calculation equations for $[dx_j, dy_j]$ are as follows:

$$dx_j = x_j - x_g \quad (9)$$

$$dy_j = y_j - y_g \quad (10)$$

When the vector sum of the relative position vectors from the individual g to neighbors of the individual is denoted as $[drx_g, dry_g]$ ($j \in N_g$), then calculation equations for $[drx_g, dry_g]$ are as follows:

$$drx_g = \sum_{j \in N_g} dx_j \quad (11)$$

$$dry_g = \sum_{j \in N_g} dj_j \quad (12)$$

Table 1 lists selected quantitative data and their data attribute descriptions. The deep learning method proposed in the present disclosure belongs to supervised learning, so it is necessary to define training data and corresponding data labels. In Table 1, $(u_g, v_g)$ is defined as a data label, and $(u_j, v_j)$ $(drx_g, dry_g)$ are defined as training data. The definition enables the deep neural network to predict the motion velocity of each individual through given $(u_j, v_j)$ and $(drx_g, dry_g)$, so as to simulate the interactive behavior of the crowd.

TABLE 1

| Data attribute and description | |
| --- | --- |
| Data attribute | Data description |
| $u_g, v_g$ | Motion velocity vector of an individual (data label) |
| $u_j, v_j$ ($j \in N_g$) | Motion velocity vector of a neighbor of an individual |
| $drx_g, dry_g$ ($j \in N_g$) | Vector sum of the relative position vectors to neighbors |

FIG. 9 depicts a correlation matrix of selected data. As shown in the figure, there is a high correlation between a velocity vector $(u_g, v_g)$ of an individual and velocities $(u_1, u_2, u_3, u_4, v_1, v_2, v_3, v_4)$ of four nearest neighbors, with a maximum correlation coefficient reaching 0.31. In addition, there is a weak correlation between speed of an individual and the vector sum $(drx_g, dry_g)$ of the relative position vectors from the individual to neighbors of the individual, and the correlation coefficient can reach 0.16. Therefore, these 10 data attributes will be used as training data sets of a neural network for deep learning of the neural network. Supervised learning of a neural network is achieved by taking the velocity vector $(u_g, v_g)$ of an individual as label data.

Secondly, build a deep convolutional neural network, and input the motion trajectory data for training to learn crowd motion behaviors, which includes the following steps.

Figure 10:
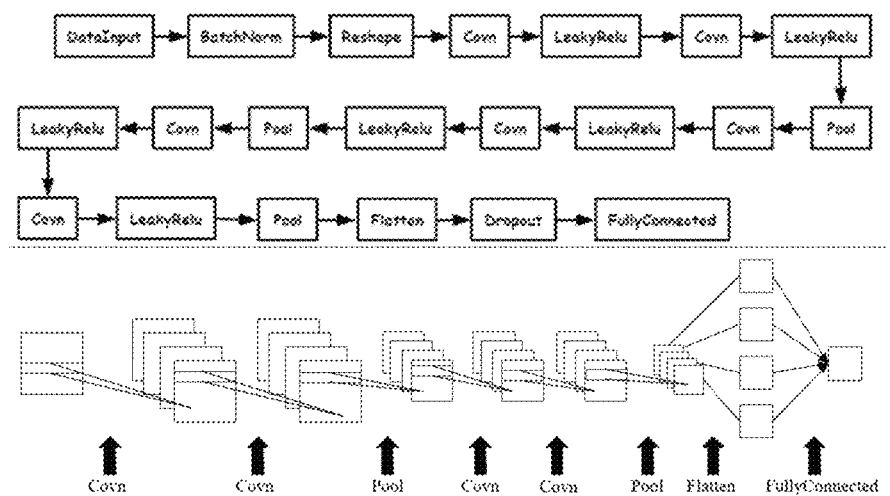
FIG. 10 is a structural diagram of the deep convolutional neural network model according to one embodiment.

The deep convolutional neural network constructed according to the present disclosure includes an input layer, an output layer and a hidden layer. The input layer contains 10 neurons, the number of which is consistent with the dimension of the selected training data set (10 related attributes). The input data is then transmitted into the hidden layer through BatchNorm normalization (BatchNorm) and data format conversion (Reshape). The result predicted by the deep neural network is the velocity $(u_g, v_g)$ of the individual on the X-axis and Y-axis, so the output layer of the neural network is a fully connected layer containing two neurons. The hidden layer is between the input layer and the output layer and includes 6 two-dimensional convolution layers, 6 LeakyReLU activation layers, 3 MaxPooling pooling layers and a Flatten layer. The network structure of the deep neural network is shown in FIG. 10.

The deep neural network training in the present disclosure is realized in the python-keras platform, and the operating system adopted is deepin-linux15.11. Deep learning training is accelerated by using CUDA9.0 and cudnn7.1, and the acceleration hardware adopted is Nvidia-1080Ti. The training number of deep learning is set to 100 epochs, and batch-size is set to 100. The training data sets and test data sets are obtained from the selected crowd trajectory data.

Figure 11:
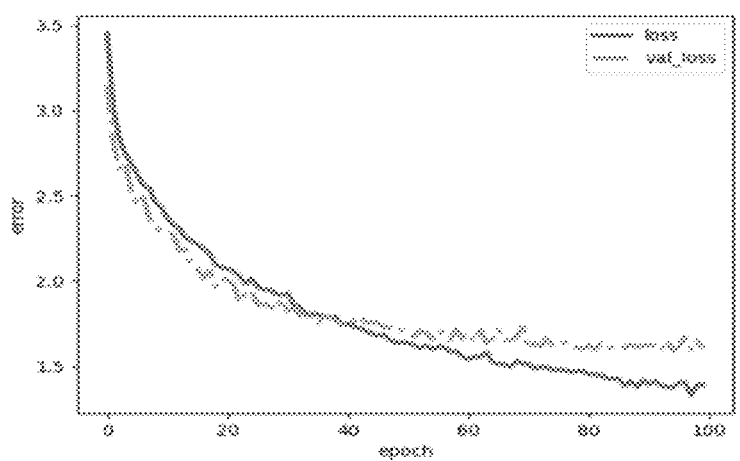
FIG. 11 is a diagram of training errors and test errors of the neural network in the training process according to one embodiment.
Figure 12:
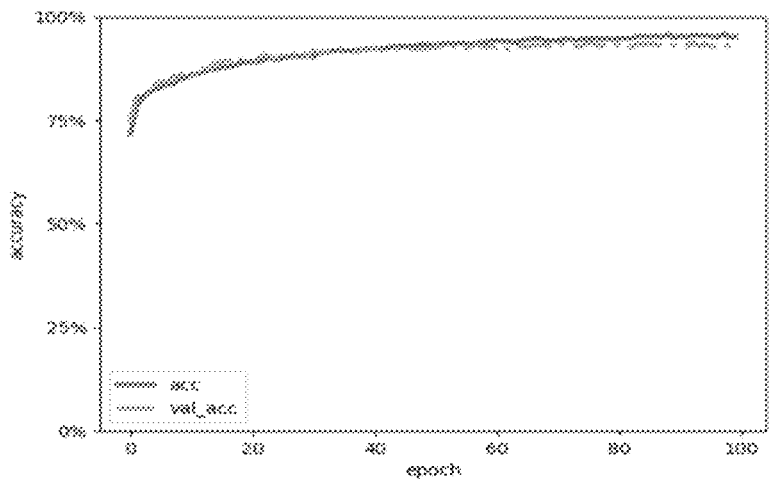
FIG. 12 shows training accuracy rate and test accuracy rate of the system in the training process according to one embodiment.

80% of the selected data are training data sets and 20% are test data sets. That is, the data amount of the training data sets is 24000×80%=19200, and the data amount of the test data set is 24000×20%=4800. FIG. 11 depicts training errors (in solid line) and test errors (in solid line) of the neural network in the training process. The error calculation method adopted is Mean-Absolute-Error. FIG. 12 depicts the training accuracy (in solid line) and test accuracy (in dotted line) of the system in the training process, and the average accuracy of the predicted value of the neural network is calculated.

Finally, set a two-dimensional space with an image size, randomly placing a plurality of simulation individuals the two-dimensional space, testing a prediction effect of the deep convolutional neural network, adjusting parameters for simulation Finally, and drawing a crowd motion trajectory, which includes the following steps.

In the present disclosure, individual accurate positioning and crowd motion trajectory prediction need to be carried out using two neural networks, so it is necessary to construct two neural networks. Deep convolutional neural network is a software program that implements computer-based simulation on the structure of neural networks in the human brain. The two convolutional neural networks used in the present disclosure adopt the structure of MaskRCNN. Mask R-CNN is a flexible and powerful image segmentation algorithm, which can complete various tasks, such as image object classification, image object detection, and image object contour recognition. In addition, some image processing steps are also an indispensable part.

According to the pixel values of an image, the horizontal and vertical axes of a two-dimensional space are set, and 60 simulation individuals are randomly placed in the two-dimensional space. The motion trajectories of these individuals are predicted using the trained deep neural network and are drawn in a map.

During an experimental process, continuous prediction calculation is conducted t (t=1000) times in the neural network, and the crowd motion trajectory in a virtual experiment platform is simulated.

Figure 13:
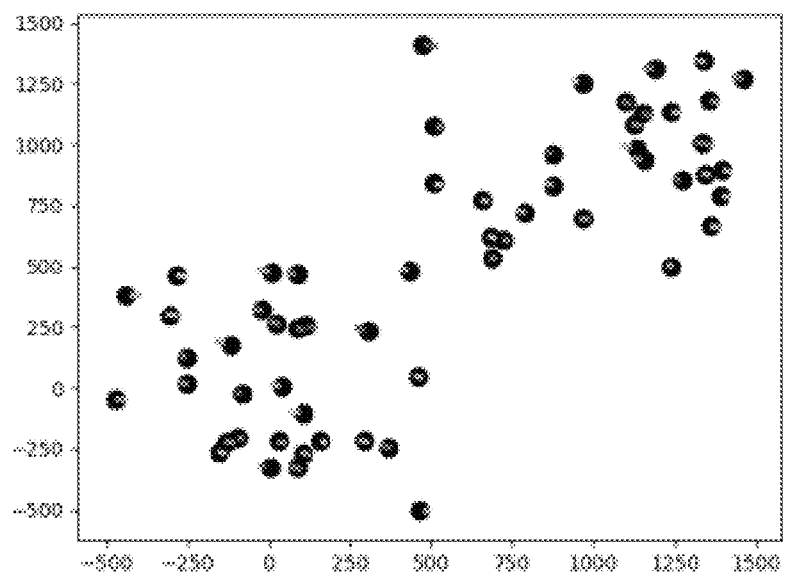
FIG. 13 shows an initial crowd state diagram at t=0 according to one embodiment.
Figure 14:
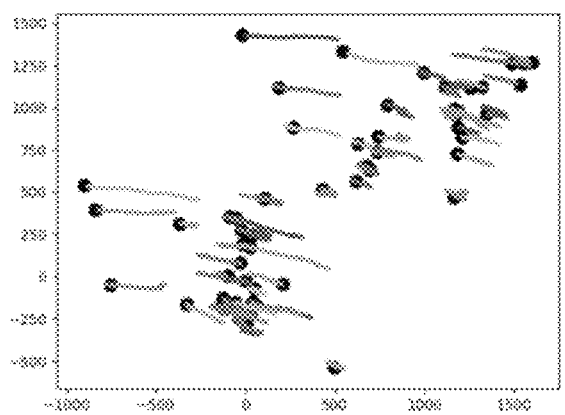
FIG. 14 shows a crowd state diagram at t=50 according to a further embodiment.
Figure 15:
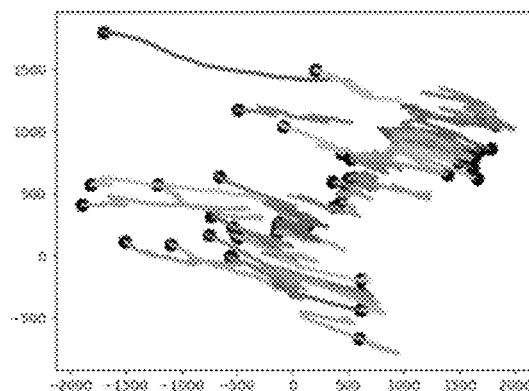
FIG. 15 shows a crowd state diagram at t=200 according to yet another embodiment.
Figure 16:
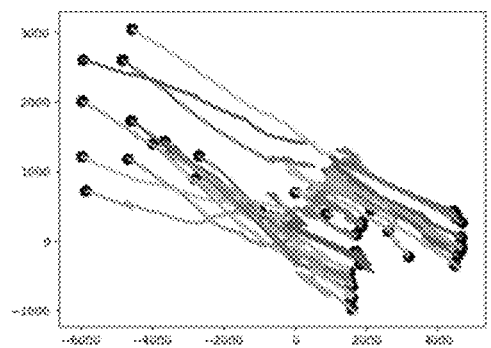
FIG. 16 shows a crowd state diagram at t=500 according to still a further embodiment.

FIG. 13 shows an initial crowd state at t=0. In the initial state, the crowd is randomly distributed in two-dimensional space, and the initial velocity of the individual is a random number between 0 cm/s-100 cm/s. FIG. 14 shows that when t=50, the crowd begin to move in different directions under the influence of random speed and neighbors. As shown in FIG. 15, when prediction is conducted t (t=200) times, neighboring individuals begin to show crowd behaviors, and the whole crowd is divided into two sub crowds, which move in two opposite directions. The crowd behaviors are similar to the way a crowd move in a real video. As shown in FIG. 16, when t=500, two crowds continue to move in both directions at a similar speed and trajectory, and also reach a state of balance.

All trajectories show crowd behaviors similar to those in the real world. An individual can maintain a stable distance from neighbors of the individual and follow them at a steady speed. The path choice for a crowd is affected by such factors as crowd density, initial speed, surrounding pedestrian speed and distance. The simulation results show that the prediction result of the neural network accords with the crowd motion behavior in the real scenario, that is, the simulation method proposed by the present disclosure is real and effective.

The present disclosure has the following beneficial effects:

(1) The CSRnet convolutional neural network is used to extract the crowd density map of each video frame. In order to solve the problem that the convolutional layer leads to smaller output image, the back end of the CSRnet network in the present disclosure adopts a dilated convolution layer. While maintaining high resolution, the perceptual region is expanded, so as to generate a high-quality crowd distribution density map.

(2) OpenCV and DBSCAN algorithms are used to determine the precise location of individuals in each video frame to achieve automatic individual location recognition, thereby saving both time and effort.

(3) The DBSCAN clustering algorithm is used to conduct inter-frame clustering on the individual positions, so as to obtain the complete motion trajectory of each individual in the video, thus obtaining crowd motion trajectory data.

(4) The deep convolutional neural network is used to learn the crowd behaviors, which is different from the mode of controlling crowd behaviors according to a series of pre-defined motion rules in the traditional method. Mutual influence of various factors affecting the crowd movement is considered in the present disclosure, thereby improving the accuracy of simulation.

The embodiments described above are only descriptions of preferred embodiments of the present invention and are not intended to limit the scope of the present invention. Various variations and modifications can be made to the technical solution of the present invention by those of ordinary skills in the art, without departing from the design and spirit of the present invention. The variations and modifications should all fall within the claimed scope defined by the claims of the present invention.

What is claimed is:

1. A crowd motion simulation method based on real crowd motion videos, comprising the following steps:
   (1) shooting a real crowd motion video, framing the real crowd motion video and storing a framed video as a plurality of continuous high-definition images, generating a crowd density map on the high-definition images, and accurately positioning an individual in each crowd density map to obtain an accurate position of each individual in the high definition images;
   (2) correlating the positions of each individual in different high definition images to form a complete motion trajectory, and extracting a motion trajectory data;
   (3) quantifying the motion trajectory data, calculating a data correlation, and selecting a training data and at least one data label;
   (4) building a deep convolutional neural network using a processor, and inputting the motion trajectory data processed in Step (3) to learn at least one crowd motion behavior; and
   (5) setting a two-dimensional space with an image size, randomly placing a plurality of simulation individuals in the two-dimensional space, testing a prediction effect of the deep convolutional neural network, adjusting a plurality of parameters for simulation, and drawing a crowd motion trajectory on the high definition images, wherein the quantifying motion trajectory data in Step (3) specifically comprises the substeps:
- (3a) obtaining an individual g, a neighbor of the individual Ng, a motion velocity vector [$u_g$, $v_g$] of the individual, and a motion vector [$u_j$, $v_j$]($j \in N_g$, j=1, 2, . . . , n) of the neighbor of the individual; and
- (3b) calculating a relative position vector from the individual g to a neighbor of the individual by equations (7) and (8):

$$dx_j = x_j - x_g \qquad (7)$$

$$dy_j = y_j - y_g \qquad (8)$$

wherein position coordinates of the individual g are denoted as [$x_g$, $y_g$], coordinates of a neighbor of the individual are demoted as [$x_j$, $y_j$]($j \in N_g$), the relative position vector from the individual g to a neighbor of the individual is denoted as [$drx_j$, $dy_j$]($j \in N_g$), and a set of neighbors of the individual g is denoted as Ng; and
- (3c) calculating a vector sum of relative position vectors from the individual to neighbors of the individual by equations (9) and (10):

$$drx_g = \sum_{j \in N_g} dx_j \qquad (9)$$

$$dry_g = \sum_{j \in N_g} dy_j \qquad (10)$$

wherein the vector sum of the relative position vectors from the individual g to neighbors of the individual is denoted as [$drx_g$, $dry_g$]($j \in N_g$).

2. The crowd motion simulation method based on real crowd motion videos of claim 1, wherein Step (1) comprises the substeps:
- (1a) shooting real crowd videos from a bird's eye view, extracting each frame of the videos and saving the extracted videos into high-definition images;
- (1b) extracting a crowd density map of each image by a CSRnet convolutional neural network, and classifying the density map according to a crowd density value in the crowd density map in the following manner: when the density value is lower than a threshold, defining the density map by convolution of an impulse function with a Gaussian kernel; and when the crowd density is higher than the threshold, defining the density map by an adaptive Gaussian kernel;
- (1c) denoising the density map, calculating, by OpenCV, a contour of each point in the density map in a manner of pixel cycling, and calculating a centroid of the contour; and
- (1d) clustering the centroid using a DBSCAN algorithm, and calculating an average value of clustered centroid points to obtain an accurate position of each individual in the image.

3. The crowd motion simulation method based on real crowd motion videos of claim 2, wherein the CSRnet convolutional neural network in Step (1b) comprises a VGG-16 convolutional neural network and a dilated convolution layer, with a convolution kernel size of 3 and a pooling layer of 2×2, and the convolution of an impulse function with a Gaussian kernel adopts a calculation equation (1):

$$H(x) = \sum_{i=1}^{N} \delta(x - x_i) \qquad (1)$$

wherein $x_i$ denotes a position of an assumed labeling point, N denotes a number of heads in an image, and $\delta(x - x_i)$ denotes an impulse function.

4. The crowd motion simulation method based on real crowd motion videos of claim 2, wherein the adaptive Gaussian kernel in Step (1b) is calculated by equations (2), (3), and (4):

$$F(x) = \sum_{i=0}^{N} \delta(x - x_i) \cdot G_{\delta_i}(x) \qquad (2)$$

$$\delta_i(x) = \beta \overline{d_i} \qquad (3)$$

$$\overline{d_i} = \frac{1}{m} \sum_{j=1}^{m} d_j^i \qquad (4)$$

wherein G(x) denotes a Gaussian kernel function, $\delta_i$ is variable and is proportionate to $\overline{d_i}$, m denotes a number of heads adjacent to an ith head, $d_j^i$ denotes a distance between the ith head and a jth adjacent head, $\overline{d_i}$ denotes an average distance of distances from m adjacent heads, and β denotes a constant.

5. The crowd motion simulation method based on real crowd motion videos of claim 2, wherein the centroid of the contour in Step (1c) is calculated by equations (5) and (6):

$$x = \frac{\sum_{i=1}^{n} p_i x_i}{\sum_{i=1}^{n} p_i} \qquad (5)$$

$$y = \frac{\sum_{i=1}^{n} p_i y_i}{\sum_{i=1}^{n} p_i} \qquad (6)$$

wherein $x_i$ and $y_i$ denote a coordinate of a certain pixel point in an image in an x direction and a y direction, respectively, $p_i$ denotes a pixel value of a certain pixel point in an image, and n denotes a number of pixel points in an image.

6. The crowd motion simulation method based on real crowd motion videos of claim 1, wherein the correlating the positions of each individual in different images to form a complete motion trajectory, and extracting motion trajectory data in Step (2) comprises the substeps:
- (2a) clustering the positions of the individual between images by adopting a DBSCAN clustering algorithm to obtain a clustering trajectory of the individual; and
- (2b) performing smoothing on the clustering trajectory by a Kalman filter to obtain smooth and continuous motion trajectory data.

7. The crowd motion simulation method based on real crowd motion videos of claim 1, wherein the deep convolutional neural network built in Step (4) comprises an input layer, an output layer and a hidden layer, the input layer comprises n neurons, n denotes a dimension value of a training data set, data of the input layer are transmitted into the hidden layer through BatchNorm normalization (BatchNorm) and data format conversion (Reshape), the hidden layer is between the input layer and the output layer and comprises a two-dimensional convolution layer, a LeakyReLU activation layer, a MaxPooling pooling layer and a Flatten layer, and the output layer is a fully connected layer; and the motion trajectory data processed in Step (3) are input for training to learn the crowd motion behaviors.

8. The crowd motion simulation method based on real crowd motion videos of claim 1, wherein the randomly placing a plurality of simulation individuals in the two-dimensional space, testing a prediction effect of the deep convolutional neural network, adjusting parameters for simulation, and drawing a crowd motion trajectory in Step (5) comprises the substeps:
   (5a) randomly placing the simulation individuals in the two-dimensional space, and predicting a motion trajectory of each of the individuals using the deep neural network; and
   (5b) conducting continuous prediction calculation t times in the neural network, and simulating the crowd motion trajectory in a virtual experiment platform.

* * * * *